(12) United States Patent
Yoshie

(10) Patent No.: US 7,910,862 B2
(45) Date of Patent: *Mar. 22, 2011

(54) APPARATUS AND METHOD FOR MANUFACTURING A SEMICONDUCTOR DEVICE WITH A SAPPHIRE SUBSTRATE

(75) Inventor: Toru Yoshie, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 454 days.

This patent is subject to a terminal disclaimer.

(21) Appl. No.: 11/753,069

(22) Filed: May 24, 2007

(65) Prior Publication Data

US 2008/0011738 A1    Jan. 17, 2008

(30) Foreign Application Priority Data

Jul. 14, 2006  (JP) ................................ 2006-194789

(51) Int. Cl.
*H05B 3/68* (2006.01)
(52) U.S. Cl. .................. 219/460.1; 219/444.1
(58) Field of Classification Search ............... 219/443.1, 219/444.1, 390; 392/416, 418; 432/247, 432/253, 254.1
See application file for complete search history.

(56) References Cited

U.S. PATENT DOCUMENTS

| | | | | |
|---|---|---|---|---|
| 4,518,848 A | * | 5/1985 | Weber | 219/388 |
| 5,169,684 A | * | 12/1992 | Takagi | 427/248.1 |
| 5,343,012 A | * | 8/1994 | Hardy et al. | 118/725 |
| 5,772,770 A | * | 6/1998 | Suda et al. | 118/719 |
| 6,090,210 A | * | 7/2000 | Ballance et al. | 118/725 |
| 6,170,433 B1 | * | 1/2001 | Du Bois | 118/725 |
| 6,395,363 B1 | * | 5/2002 | Ballance et al. | 428/64.1 |
| 6,471,770 B2 | | 10/2002 | Koike et al. | |
| 6,518,548 B2 | * | 2/2003 | Sugaya et al. | 219/444.1 |
| 6,679,947 B2 | | 1/2004 | Koike et al. | |
| 7,156,924 B2 | * | 1/2007 | Renken | 118/725 |
| 7,572,333 B2 | * | 8/2009 | Yoshie | 117/95 |
| 2005/0191044 A1 | * | 9/2005 | Aderhold et al. | 392/418 |

FOREIGN PATENT DOCUMENTS

JP    10-070313    10/1998

* cited by examiner

*Primary Examiner* — Sang Y Paik
(74) *Attorney, Agent, or Firm* — Volentine & Whitt, P.L.L.C.

(57) ABSTRACT

A supporting base, including a supporting plate and holders, holds a sapphire substrate so that one substrate surface faces a hot plate and the other substrate surface faces a radiant heat absorbing plate mounted on the supporting plate. Radiant heat from the hot plate passes through the sapphire substrate and heats the radiant heat absorbing plate. The sapphire substrate is heated from both sides by air warmed by the hot plate and radiant heat absorbing plate, and therefore does not warp. When the temperature of the sapphire substrate has reached the necessary level, the supporting base delivers the sapphire substrate to the surface of the hot plate, then moves away while the sapphire substrate is held against the hot plate and a semiconductor fabrication process is carried out on the sapphire substrate.

19 Claims, 6 Drawing Sheets

APPARATUS AND METHOD FOR MANUFACTURING A SEMICONDUCTOR DEVICE WITH A SAPPHIRE SUBSTRATE

BACKGROUND OF THE INVENTION

1. Field of the Invention

The present invention relates to a method and equipment useful in the manufacture of a semiconductor device on a sapphire substrate, more particularly to a method and equipment for use in a fabrication process that requires heating of the sapphire substrate.

2. Description of the Related Art

A semiconductor device fabricated by forming transistors in a thin semiconductor film such as a silicon (Si) film grown epitaxially on a crystalline sapphire ($AL_2O_3$) substrate exhibits far better transistor characteristics than a semiconductor device fabricated on a silicon wafer. One effect of the sapphire substrate is reduced parasitic capacitance.

Another advantage of fabrication on a sapphire substrate is that substantially the same fabrication process can be used as for a silicon wafer, so the same fabrication equipment can be used. A silicon-on-sapphire fabrication line can therefore be set up at a low cost.

When the silicon wafer fabrication process is applied to a sapphire wafer, however, problems arise because of the lower thermal conductivity of the sapphire substrate, and because of its transparency, which causes it to absorb infrared radiation and other forms of radiated heat at a lower rate.

A known method of coping with the transparency problem is to form a thin film of light-absorbing material or electrically conductive material on the underside of the sapphire substrate. Fabrication processes that require preheating of the substrate can then be preceded by a step of radiative or resistive heating of the thin film, from which heat is conducted into the substrate. This method is described in, for example, Japanese Patent Application Publication No. 10-70313 (paragraphs 0019-0032 and FIGS. 3 and 4).

This conventional method, however, suffers from a further problem. If the fabrication process that requires preheating of the substrate is carried out in a comparatively low ambient atmospheric temperature, as in the case in atmospheric-pressure chemical vapor deposition (CVD), for example, then when the sapphire substrate is heated by thermal conduction from the thin film on its underside, due to the low thermal conductivity of sapphire, a temperature difference develops between the upper and lower surfaces of the substrate, causing it to warp in a way that makes it higher at the rim than in the center. As a result, the underside of the substrate becomes convex and therefore difficult to hold by vacuum suction, which is the technique generally used in wafer-handling apparatus.

FIGS. 1 to 6 illustrate an experiment performed by the inventor in investigating this problem. A thin round disc of sapphire was used as a sapphire substrate 1. A hot plate 51 with an internal heater 52 was used to heat the sapphire substrate 1. The experimental apparatus also included a room temperature plate 53, which was kept at the ambient atmospheric temperature, that is, at room temperature. The hot plate 51 was heated by the heater 52 to a temperature of 350° C. while the ambient atmospheric temperature was left unchanged. The sapphire substrate 1 was then placed on the hot plate 51 and its warping behavior was observed. In the following description, the substrate surface on which an epitaxial layer has been or will be created for formation of integrated circuit elements is referred to as its first major surface, the opposite surface being referred to as the second major surface.

In the experiment, the second major surface of the sapphire substrate (1) was placed on the upper surface of the hot plate 51 (FIG. 1). Immediately, the flat sapphire substrate 1 began to warp, becoming saucer-shaped with its second major surface convex. After an elapse of approximately ten seconds, the second major surface became so convex that only its central portion touched the upper surface of the hot plate 51 (FIG. 2). The explanation for this is warping is that, due to the low thermal conductivity of the sapphire substrate 1, a temperature gradient developed in the thickness direction of the sapphire substrate 1, so that the heated second major surface was at a higher temperature than the first major surface, which was exposed to the ambient atmospheric temperature. Accordingly, a difference in thermal expansion developed between the first and second major surfaces, and the second major surface expanded more than the first major surface, pulling and lifting the rim of the sapphire substrate 1 upward.

The sapphire substrate 1 was left in this condition for more than five minutes, but the warping remained unchanged (FIG. 3). The explanation is that the central portion of the second major surface of the sapphire substrate 1, which contacted the hot plate 51, remained thermally expanded by the heat, preventing the sapphire substrate 1 from returning to its original flat shape even though its rim, which had moved away from the hot plate 51, was cooling.

The warped sapphire substrate 1 was then removed from the hot plate 51 and placed immediately with its convex second major surface on the upper surface of the room temperature plate 53 (FIG. 4). This caused the direction of warp to reverse, so that the first major surface became convex, the center of the sapphire substrate 1 now being higher than the rim (FIG. 5). The explanation for this behavior is that the central portion of the second major surface of the sapphire substrate 1 was rapidly cooled by contact with the room temperature plate 53 and its temperature became lower than the temperature of the rim. As a result, the central portion of the second major surface contracted, pulling the rim inward and downward, thereby producing a tensile force that lifted the central portion of the sapphire substrate 1.

When left in this condition on the room temperature plate 53, in several minutes the sapphire substrate 1 returned to its original flat shape as shown in FIG. 6, indicating that the entire area of the sapphire substrate 1 had cooled to room temperature.

Next, the hot plate was heated to 380° C. and positioned about one millimeter (1 mm) away from the second major surface of a sapphire substrate to investigate the effect of non-contact heating in an atmospheric environment.

FIG. 7 is a graph illustrating temperature changes in the sapphire substrate as it underwent non-contact heating. The data in FIG. 7 were obtained by attaching thermocouples to the rim of the sapphire substrate and the center of its first major surface and measuring the temperature changes over time. The solid line indicates the temperature at the center, the dotted line indicates the temperature at the rim, and the dot-dash line indicates, for comparison, the temperature at the center of a silicon substrate heated in the same manner.

As can be seen from FIG. 7, the temperature of the sapphire substrate initially increased more slowly than the temperature of the silicon substrate. The temperature at the rim of the sapphire substrate stabilized at about 320° C. Above 200° C., however, the temperature at the center of the sapphire substrate started to increase more rapidly than the temperature at the rim, and around 330° C., the increase became very steep, quickly reaching 380° C., which was the temperature setting of the hot plate. In contrast, the temperature at the center of the silicon substrate did not show the steep temperature change seen at the center of the sapphire substrate.

These heating curves can be explained as follows. Even in non-contact heating, when a sapphire substrate is heated from one side, heat is transferred by air convection from the hot plate to the adjacent sapphire surface, thereby causing a temperature gradient in the thickness direction of the sapphire substrate, the heated surface becoming hotter than the opposite surface, which is exposed to air at room temperature. This temperature difference causes the sapphire substrate to warp so that its second major surface becomes convex as shown in FIG. 2, bringing the central portion of the substrate closer to the hot plate. The temperature in the center of the substrate then increases rapidly, bringing the central portion into contact the hot plate.

In short, when heated from one side in a comparatively low temperature ambient atmospheric, a sapphire substrate will warp, regardless of whether the heating is by contact or not. Similar warping occurs in the method described in Japanese Patent Application Publication No. 10-70313.

The amount of warping caused by a temperature difference between the first and second major surfaces of a sapphire substrate is estimated below on the basis of the thermal expansion curve shown in FIG. 8. The horizontal axis in FIG. 8 represents the temperature of the sapphire substrate and the vertical axis represents the thermal expansion ratio in percent, determined by measuring total length extension as compared with length at a temperature of absolute zero. Thermal expansion in the c-axis direction of the sapphire crystal is shown by the solid line with white data points and thermal expansion in a direction perpendicular to the c-axis is shown by the dotted line with black data points.

The coefficient of thermal expansion, which can be determined as the slope of the curves in FIG. 8, is approximately eight parts per million per degree Celsius (8 ppm/° C.). Accordingly, when a temperature difference of about 60° C. occurs between the first and second major surfaces of a sapphire substrate, the extension difference with respect to the diameter of the sapphire substrate becomes about 480 ppm. For a sapphire substrate six inches in diameter and six hundred twenty-five micrometers (625 μm) thick, this extension difference produces a warp of about 2 mm. More precisely, for a sapphire substrate with these dimensions, a 2-mm warp is equivalent to an extension difference between the first and second major surfaces of about 450 ppm.

In addition, the following problems have been observed, indicating that the extent of warping of a sapphire substrate during preheating is not a simple phenomenon. Moreover, these observations are only two examples.

(1) Warping of up to several tens of micrometers occurs during fabrication of a sapphire substrate. A sapphire substrate that is warped so that its central portion is convex by several tens of micrometers toward the hot plate has a particular tendency to warp further during preheating.

(2) When various films are formed on a sapphire substrate in order to fabricate semiconductor devices on the substrate, the films change the radiant heat absorption coefficient of the substrate, which creates temperature gradients in directions parallel to the substrate surface, causing local warping during preheating.

SUMMARY OF THE INVENTION

An object of the present invention is to provide a semiconductor fabrication apparatus with means of controlling the warping of a sapphire substrate in a fabrication process that requires heating of the sapphire substrate.

The invented semiconductor fabrication apparatus includes a hot plate for heating a sapphire substrate in an atmospheric environment. The sapphire substrate has a first major surface and a second major surface. A supporting base, including a supporting plate and holders, holds the sapphire substrate between the hot plate and the supporting plate so that the hot plate faces the second major surface. A radiant heat absorbing plate disposed on the supporting plate faces the first major surface but is separated by a certain distance from the first major surface. A lifting device raises and lowers the supporting base.

When the invented semiconductor fabrication apparatus is used, first the sapphire substrate is held by the supporting base so that is separated from the hot plate by a certain distance and the hot plate is heated, preferably to a temperature at least 300° C. higher than the ambient atmospheric temperature. Some of the radiant heat from the hot plate passes through the sapphire substrate and is absorbed by the radiant heat absorbing plate, so that the radiant heat absorbing plate is also heated. The sapphire substrate is accordingly heated from its second major surface by the hot plate and from its first major surface by the radiant heat absorbing plate. When the temperature of the sapphire substrate has reached the necessary level, the lifting device moves the second major surface of the sapphire substrate toward the hot plate, the sapphire substrate is held against the hot plate, and a semiconductor fabrication process is carried out on the sapphire substrate.

The invented semiconductor fabrication apparatus heats the air on both sides of the sapphire substrate. Heat is transferred to the sapphire substrate through the air on both sides, so the sapphire substrate is heated in a substantially uniform manner and does not warp significantly. The semiconductor fabrication process that requires the sapphire substrate to be heated can accordingly be carried out efficiently, without the occurrence of substrate handling problems due to warping.

Before the heated sapphire substrate is brought into contact with the hot plate, it may be moved close to the hot plate and a flow of gas may be directed onto the second major surface of the sapphire substrate through one or more holes in the hot plate. The gas flow has a cooling effect and can be used to prevent warping by redistributing heat.

In another aspect of the invention, gas is expelled onto the central part of the second major surface of the sapphire substrate during the entire preheating process to cool the central part, thereby counteracting a tendency of the central part to warp toward the hot plate. The radiant heat absorbing plate may be omitted if this central cooling effect is sufficient to prevent warping. The preheating process may be carried out in two stages: a first stage in which the sapphire substrate is brought to the desired temperature, and a second stage in which the sapphire substrate is moved closer to the hot plate while the expulsion of gas continues.

DETAILED DESCRIPTION OF THE INVENTION

Figure 1:
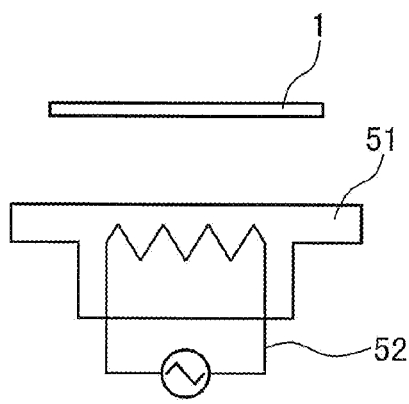
FIGS. 1, 2, 3, 4, 5, and 6 are sectional drawings illustrating the warping experiment described above.
Figure 4:
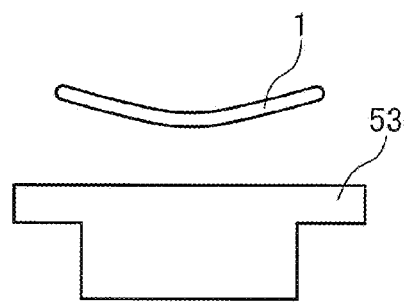

Embodiments of the invention will now be described with reference to the attached drawings, in which like elements are indicated by like reference characters.

First Embodiment

Figure 9:
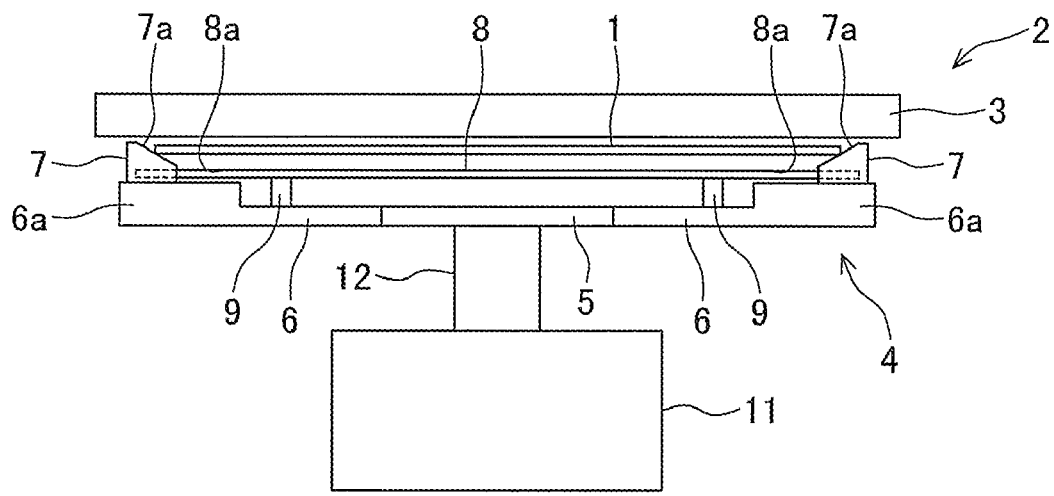
FIG. 9 is a sectional view showing semiconductor fabrication apparatus according to a first embodiment of the invention.
Figure 10:
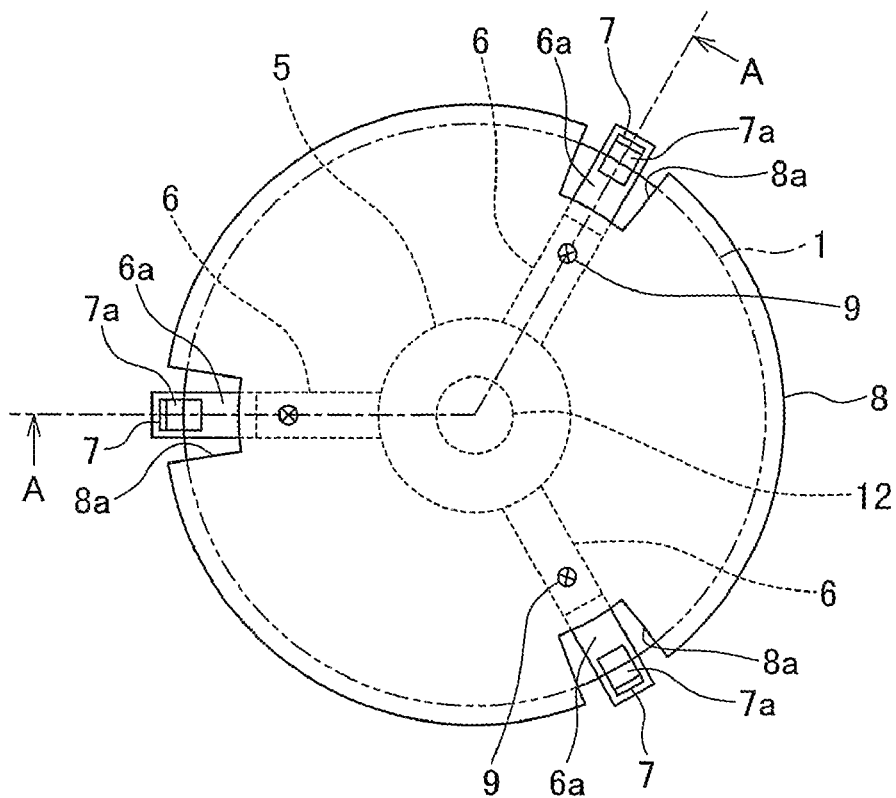
FIG. 10 is a top plan view of the semiconductor fabrication apparatus in the first embodiment.

FIGS. 9 and 10 illustrate semiconductor fabrication apparatus according to a first embodiment of the invention. FIG. 9 is a sectional view through line A-A in FIG. 10. FIG. 10 shows the semiconductor fabrication apparatus without the hot plate and sapphire substrate shown in FIG. 9.

The semiconductor fabrication apparatus 2 in FIGS. 9 and 10 is used in a fabrication process that is carried out at a comparatively low temperature, in an atmospheric environment, for example, after the sapphire substrate and other parts of the fabrication equipment have been preheated to a higher temperature. An example of such a process is atmospheric-pressure CVD.

The sapphire substrate 1 in this embodiment is, for example, a crystalline sapphire disc six inches in diameter with a thickness of 0.3 to 0.8 mm.

The apparatus includes a hot plate 3 heated by, for example, an electric heater. The hot plate 3 is disc-shaped, with a larger diameter than the sapphire substrate 1, which is disposed below the hot plate. The sapphire substrate 1 is supported by holders 7 (described later) in an upside-down position so that its second major surface faces the hot plate 3. The hot plate 3 is used not only to preheat the sapphire substrate 1 but also as a susceptor on which the heated sapphire substrate 1 is held while a semiconductor fabrication process is carried out.

The apparatus also includes a supporting base 4 comprising a disc-shaped supporting plate 5 that faces the hot plate 3, three L-shaped arms 6 disposed evenly around the circumference of the supporting plate 5, to which they and welded or otherwise joined, a platform 6a formed at the end of each arm 6, and a holder 7 attached to each platform 6a.

The number of arms 6 is not restricted to three; there may be four or more arms. In an alternative configuration, the arms 6 are integral with the supporting plate 5.

Each holder 7 is a prismatic member made of silica glass, for example, and has a sloping surface 7a. The rim of the sapphire substrate 1 rests on the sloping surfaces 7a of the holders 7. The sapphire substrate 1 is placed level on the holders 7 so that its second major surface faces the hot plate 3.

The apparatus also includes a radiant heat absorbing plate 8. The radiant heat absorbing plate 8 is a disc-shaped plate made of, for example, aluminum (Al), having a diameter equal to or greater than the diameter of the sapphire substrate 1. The radiant heat absorbing plate 8 is disposed between the supporting plate 5 and the sapphire substrate 1, facing the first major surface of the sapphire substrate 1, from which it is separated by a certain distance. The circumference of the radiant heat absorbing plate 8 has notches 8a at the locations of the holders 7. The holders 7 protrude through the notches 8a to support the sapphire substrate 1 above the upper surface of the radiant heat absorbing plate 8. The radiant heat absorbing plate 8 is attached to the arms 6 of the supporting base 4 by fasteners 9 such as flat head screws, which determine the spacing between the upper surface of the radiant heat absorbing plate 8 and the first major surface of the sapphire substrate 1. The radiant heat absorbing plate 8 is heated by absorption of radiant heat transmitted through the sapphire substrate 1.

The apparatus also includes a lifting device 11 with a cylindrical shaft 12 attached to the supporting plate 5. By moving the shaft 12 up and down, the lifting device 11 raises and lowers the supporting base 4.

Figure 2:
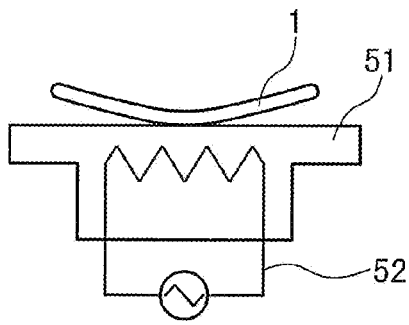
Figure 5:
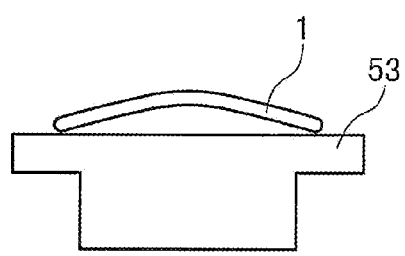
Figure 3:
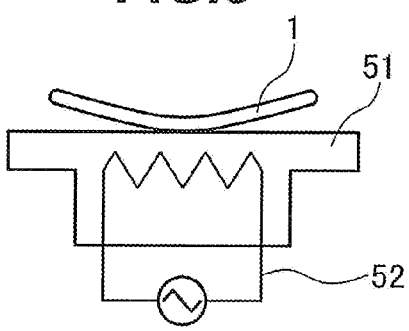
Figure 6:
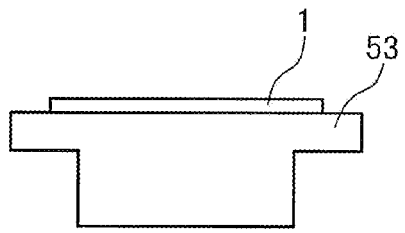

During the preheating process, the distance between the upper surface of the radiant heat absorbing plate 8 and the lower surface of the hot plate 3 is preferably at least three times the thickness of the sapphire substrate 1, but not more than five millimeters (5 mm). If the distance between the upper surface of the radiant heat absorbing plate 8 and the lower surface of the hot plate 3 is greater than 5 mm, the radiant heat absorbing plate 8 will not be sufficiently heated by the radiant heat transmitted through the sapphire substrate 1. If this distance is less than three times the thickness of the sapphire substrate 1, either the distance between the sapphire substrate 1 and the upper surface of the radiant heat absorbing plate 8 or the distance between the sapphire substrate 1 and the lower surface of the hot plate 3 becomes less than the thickness of the sapphire substrate 1. Warping due to variations during formation of the sapphire substrate 1 may then cause the central portion of the sapphire substrate 1 to approach the hot plate 3 or the radiant heat absorbing plate 8 too closely, accelerating the heating of the center of the substrate as explained above (FIG. 7) and thereby causing further warping, ultimately bringing the central portion of the sapphire substrate 1 into contact with the hot plate 3 or the radiant heat absorbing plate 8, resulting in a warp like the one shown in FIG. 2. If the sapphire substrate 1 contacts the radiant heat absorbing plate 8, there is also a risk that the first major surface of the sapphire substrate 1, that is, the surface on which semiconductor circuit elements are formed, will be contaminated.

In the present embodiment, the sloping surfaces 7a of the holders 7 are designed to hold the sapphire substrate 1 so that its first major surface is separated by 2 mm from the upper surface of the radiant heat absorbing plate 8, and during preheating, the second major surface of the sapphire substrate 1 is held at a distance of 1 mm from the lower surface of the hot plate 3.

With the semiconductor fabrication apparatus 2 of the present embodiment, the sapphire substrate 1 is heated as follows. Infrared radiation and other forms of heat radiation from the hot plate 3 pass through the sapphire substrate 1 and reach the radiant heat absorbing plate 8 disposed below the sapphire substrate 1. The radiated heat heats the radiant heat absorbing plate 8. The air between the hot plate 3 and the sapphire substrate 1 and between the radiant heat absorbing plate 8 and the sapphire substrate 1 is heated. The heated air transfers heat to the sapphire substrate 1 from both sides. As a result, despite the comparatively low thermal conductivity of the sapphire substrate 1, both of its major surfaces are heated at substantially the same rate.

To test the semiconductor fabrication apparatus 2 described above, the temperature control of the hot plate 3 was set to 380° C., a sapphire substrate 1 having a diameter of six inches and a thickness of 0.6 mm was mounted on the holders 7 of the supporting base 4, and temperature changes over time were measured using thermocouples attached to the rim of the sapphire substrate 1 and center of its first major surface.

Figure 11:
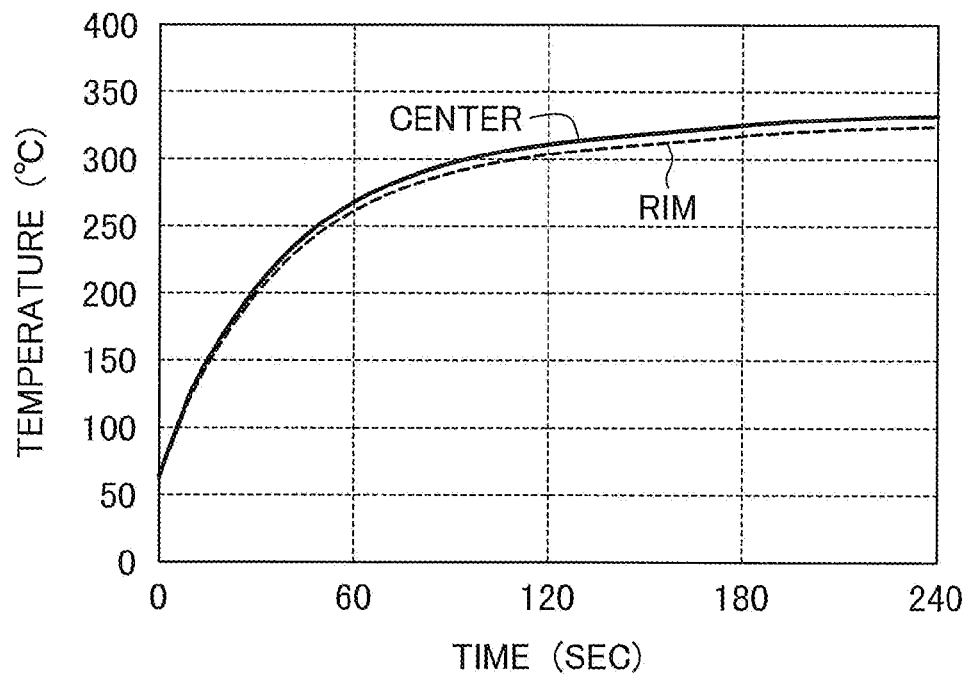
FIG. 11 is a graph illustrating temperature changes in a sapphire substrate undergoing non-contact heating in the first embodiment.

FIG. 11 shows the results when the sapphire substrate 1 was heated in an atmospheric environment under these conditions. The horizontal axis in FIG. 11 represents elapsed time and the vertical axis represents temperature. The solid line indicates the temperature at the center of the sapphire substrate 1 and the dotted line indicates the temperature at the rim. It can be seen that because of the radiant heat absorbing plate 8 disposed below the sapphire substrate 1, the temperatures at the center and rim of the sapphire substrate 1 increased evenly and stabilized at about 330° C., the final temperature difference between the center and the rim being only a few degrees Celsius.

Figure 7:
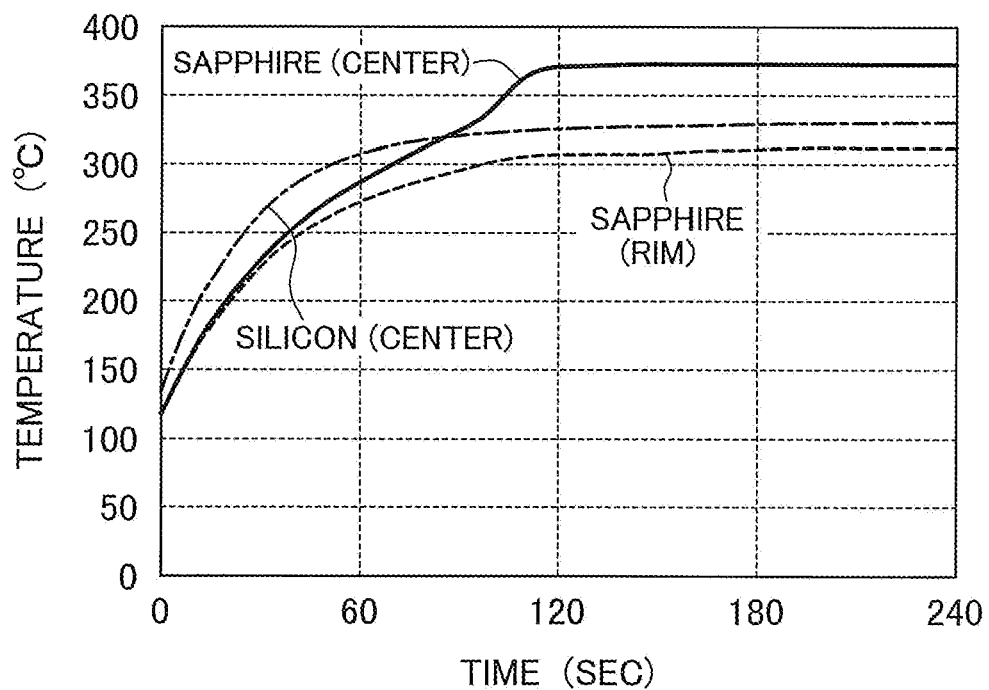
FIG. 7 is a graph illustrating temperature changes in silicon and sapphire substrates undergoing non-contact heating.
Figure 8:
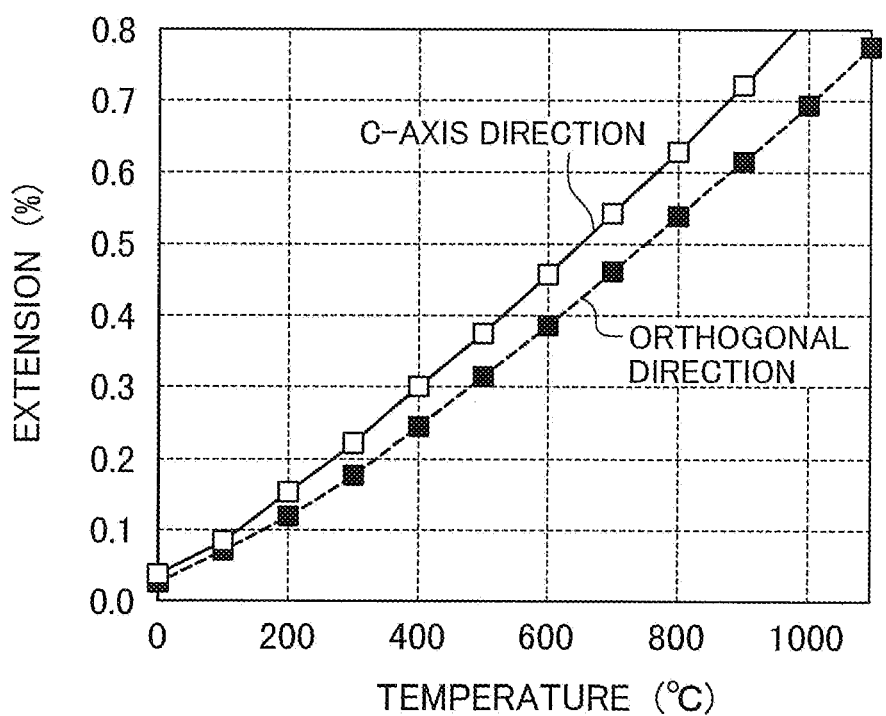
FIG. 8 is a graph of the thermal expansion characteristics of a sapphire substrate.

FIG. 11 shows no steep change in the temperature at the center of the sapphire substrate 1 as occurred in FIG. 7. This indicates that the central part of the sapphire substrate 1 did not bulge toward the hot plate 3 or the radiant heat absorbing plate 8 as it is being heated, implying that the sapphire substrate did not warp significantly.

When a semiconductor fabrication process requiring preheating of a sapphire substrate is carried out using the above semiconductor fabrication apparatus 2, first the sapphire substrate 1 is placed face down on the sloping surfaces 7a of the holders 7 on the supporting base 4 attached to the end of the lifting shaft 12, so that its first major surface is separated from the radiant heat absorbing plate 8 by 2 mm. Then, the supporting base 4 is raised toward the hot plate 3 by the lifting device 11 and stopped at a position where the distance between the hot plate 3 and the second major surface of the sapphire substrate 1 is 1 mm. The sapphire substrate 1 is thus held between the hot plate 3 and the radiant heat absorbing plate 8, spaced by appropriate distances from both of them.

Next the hot plate 3 is heated to a preset temperature (380° C. in the first embodiment). This heats the air in the space between the hot plate 3 and the sapphire substrate 1. In addition, thermal radiation from the hot plate 3 passes through the sapphire substrate 1 and heats the radiant heat absorbing plate 8, and the radiant heat absorbing plate 8 heats the air in the space between the sapphire substrate 1 and the radiant heat absorbing plate 8. Heat is transferred to the sapphire substrate 1 from the heated air on both sides, thereby increasing the temperature of the sapphire substrate 1. The temperature increase is approximately the same on both major surfaces of the sapphire substrate 1, so no significant temperature gradient develops in the thickness direction of the substrate.

The notches 8a in the radiant heat absorbing plate 8 do not significantly disrupt the uniform heating, because the platforms 6a to which the holders 7 are attached also absorb radiant heat and perform the same function as the radiant heat absorbing plate 8. For clarity, the arms 6 are shown in FIG. 10 as being narrower than the notches 8a, but the arms 6 may be as wide as or wider than the notches 8a, so that they absorb all the radiant heat that passes through the notches 8a.

When the sapphire substrate 1 reaches a predetermined preheating temperature of, for example, at least 330° C., the lifting shaft 12 is raised to make the second major surface of the sapphire substrate 1 approach the lower surface of the hot plate 3 and suction is supplied through one or more vacuum ports (not shown) in the hot plate, lifting the sapphire substrate 1 and holding it in contact with the hot plate 3.

With the sapphire substrate 1 held against the hot plate, the lifting shaft 12 is now lowered to move the holders 7 on the supporting base 4 away from the sapphire substrate 1. The desired fabrication process is then carried out on the preheated sapphire substrate 1 while it is held against the hot plate 3. An exemplary fabrication process that may be carried out in this state is the process of forming an interlayer dielectric film after the formation of gate electrodes.

The difference between the preheating temperature of the sapphire substrate 1 and the temperature to which the hot plate 3 is heated should not be more than 100° C. and is preferably not more than 50° C., so that when the sapphire substrate 1 is held against the hot plate 3, the temperature difference between the first and second major surfaces of the sapphire substrate 1 is within 100° C., and preferably within 50° C. The exemplary hot plate temperature (380° C.) and preheating temperature (330° C.) given above satisfy this condition. It has been experimentally confirmed that when the temperature difference is within 100° C., the sapphire substrate 1 can be reliably held against the hot plate 3 by vacuum suction.

The semiconductor fabrication apparatus 2 in the first embodiment is particularly useful in a process in which the hot plate 3 must be heated to a temperature at least 300° C. higher than the ambient temperature of the atmosphere surrounding the sapphire substrate 1. If the difference between the ambient temperature and the hot plate temperature is less than 300° C., warping is not such a severe problem.

As described above, in the preheating process using the semiconductor fabrication apparatus 2 of the first embodiment, the sapphire substrate 1 is heated by transfer of heat from air on both sides of the sapphire substrate, the air on one side being heated by the hot plate 3 and the air on the other side being heated by the radiant heat absorbing plate 8. Therefore, despite the comparatively low thermal conductivity of the sapphire substrate 1, the first and second major surfaces of the sapphire substrate are heated at substantially the same rate. The result is that the sapphire substrate 1 remains substantially flat and can be preheated efficiently without the occurrence of substrate handling problems due to warping.

Since the radiant heat absorbing plate 8 is heated automatically by absorbing thermal radiation from the hot plate 3, the temperature of the radiant heat absorbing plate 8 does not have to be separately monitored or controlled. The semiconductor fabrication apparatus 2 is accordingly inexpensive and easy to operate.

A general practice in semiconductor fabrication processes is to create a curtain of downward flowing air, flowing from around the hot plate 3 toward the supporting base 4, to prevent ingress of floating foreign particles such as dust. Part of this downward airflow tends to curl under the hot plate 3; however, causing an uneven cooling of the sapphire substrate 1 during the preheating process, which can also lead to warping. In the first embodiment, since the radiant heat absorbing plate 8 is disposed below and in close proximity to the sapphire substrate 1, the airflow from the air curtain is kept away from the sapphire substrate 1, eliminating another source of warping.

Since the diameter of the radiant heat absorbing plate 8 is greater than the diameter of the sapphire substrate 1, the air around the rim of the sapphire substrate 1 is reliably heated.

After various films necessary for fabricating a semiconductor device have been formed and patterned on the sapphire substrate 1, since some of these films have higher coefficients of absorption of radiant heat than the sapphire substrate, they absorb heat that would otherwise be transmitted through the sapphire substrate 1. This leads to uneven preheating of the sapphire substrate 1, parts of the substrate where these films are present being heated more than other parts. In the first embodiment, however, since thermal radiation absorbed by the films does not reach the radiant heat absorbing plate 8, the extra heating due to the presence of the films is compensated for by reduced heating from the radiant heat absorbing plate 8, so the net heating of the sapphire substrate 1 over its entire area remains substantially uniform, eliminating still another source of warping.

As described above, the semiconductor fabrication apparatus according to the present embodiment includes a hot plate for heating a sapphire substrate in an atmospheric environment and a radiant heat absorbing plate placed a certain distance from the hot plate that absorbs radiant heat from the hot plate. A supporting base with holders holds the sapphire substrate between the hot plate and the radiant heat absorbing plate. Radiant heat from the hot plate is transmitted through the sapphire substrate and absorbed by the radiant heat absorbing plate. The air surrounding the sapphire substrate is accordingly heated on both sides of the substrate, and heat is transferred to the sapphire substrate through the heated air on both sides, so the sapphire substrate is heated evenly and does not warp significantly. Semiconductor fabrication processes that require the sapphire substrate to be heated can accordingly be carried out efficiently, without encountering substrate handling problems due to warping.

Since the diameter of the radiant heat absorbing plate is greater than the diameter of the sapphire substrate, the air around the rim of the sapphire substrate is also reliably heated.

Second Embodiment

Figure 12:
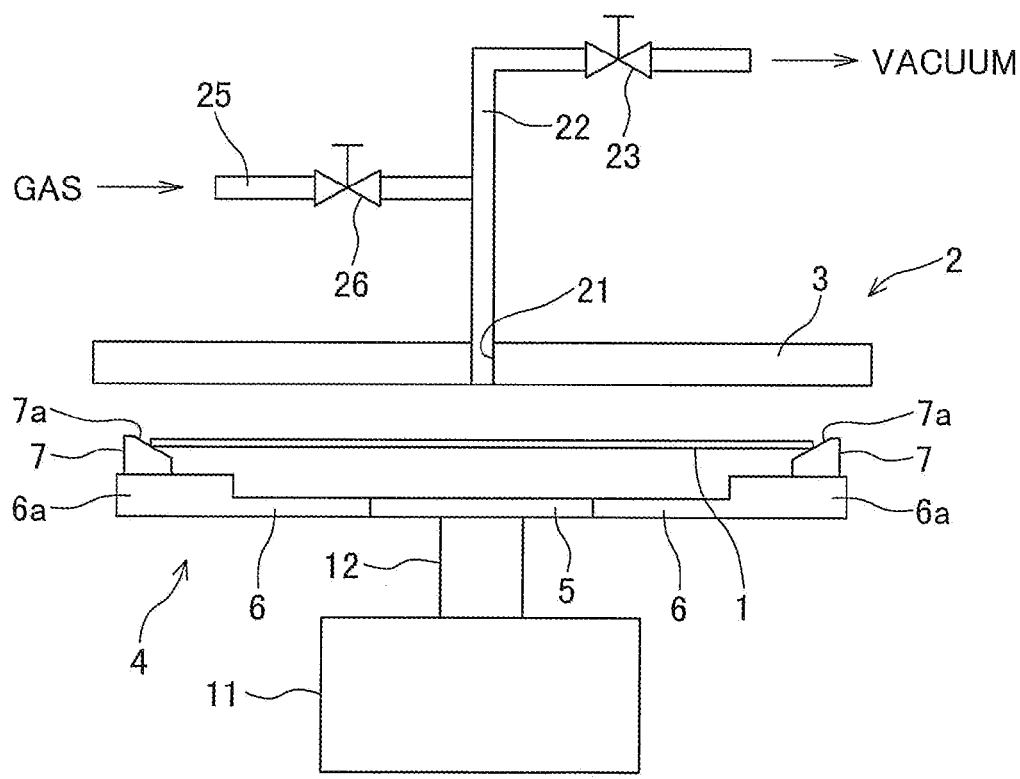
FIG. 12 is a sectional view showing semiconductor fabrication apparatus according to a second embodiment of the invention.
Figure 13:
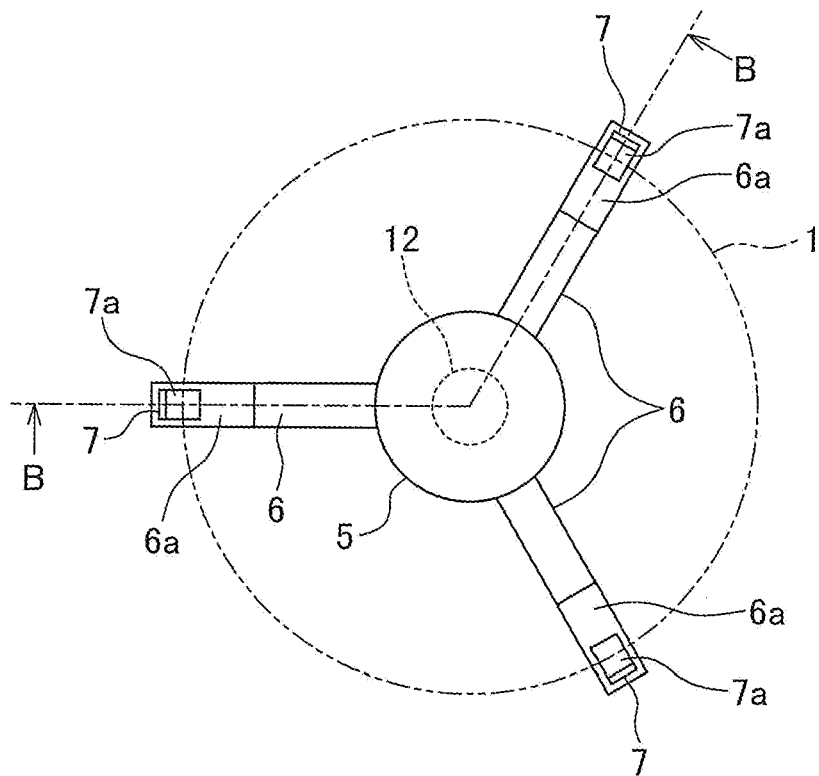
FIG. 13 is a top plan view of the semiconductor fabrication apparatus in the second embodiment.

FIGS. 12 and 13 illustrate semiconductor fabrication apparatus according to a second embodiment of the invention, FIG. 12 being a sectional view through line B-B in FIG. 13 FIG. 13 shows the semiconductor fabrication apparatus without the hot plate and sapphire substrate shown in FIG. 12.

In the semiconductor fabrication apparatus 2 of the second embodiment, as shown in FIGS. 12 and 13, the radiant heat absorbing plate 8 in the first embodiment is removed and all heating of the sapphire substrate 1 is done by the hot plate 3.

Figure 14:
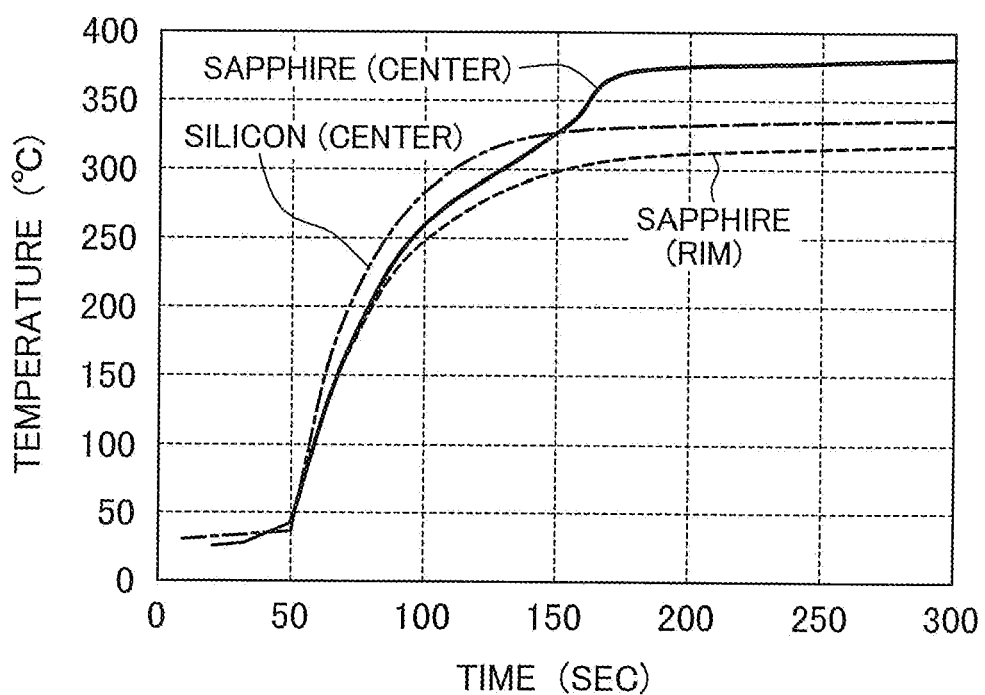
FIG. 14 is a graph illustrating temperature changes in a sapphire substrate undergoing non-contact heating in the second embodiment.

In order to understand how the sapphire substrate 1 warps under this condition, the hot plate 3 was heated to 380° C., the sapphire substrate 1 was moved to a distance of about 2 mm from the hot plate 3, and the effect of non-contact heating in an atmospheric environment was investigated. This experiment was also performed with a silicon substrate. The resulting temperature changes are illustrated in FIG. 14. The heating conditions in FIG. 14 are the same as in FIG. 7, except that, in FIG. 14, the distance between the second major surface of the sapphire substrate and the hot plate is 2 mm instead of 1 mm.

The solid line in FIG. 14 indicates the temperature at the center of the sapphire substrate, the dotted line indicates the temperature at the rim of the sapphire substrate, and the dot-dash line indicates the temperature at the center of the silicon substrate. Although the time dependency is different, the temperature curves are similar to those in FIG. 7. The excessive rise in the temperature at the center of the sapphire substrate indicates that the substrate is warping, bringing the center closer than the rim to the hot plate 3, with contact between the center of the sapphire substrate and the hot plate occurring a little after 150 seconds, where the abrupt temperature rise is seen. This warping implies that a temperature difference develops between the second major surface near the hot plate and the first major surface, which is exposed to a room temperature atmosphere.

In order to prevent the sapphire substrate 1 from warping in this preheating process, the semiconductor fabrication apparatus 2 of the second embodiment is configured as shown in FIGS. 12 and 13. The vacuum port 21 in FIG. 12 is a through-hole passing through the center of the hot plate 3 in the thickness direction, and is connected to a vacuum channel 22 that supplies vacuum suction for attracting and holding the sapphire substrate 1. The vacuum port 21 in the second embodiment also functions as a gas flow hole through which gas is expelled as described later.

A valve 23 is provided in the vacuum channel 22 to open and close the path leading to the vacuum port 21.

A gas channel 25 connected to the vacuum channel 22 between the valve 23 of the vacuum channel 22 and the vacuum port 21 supplies a gas such as nitrogen ($N_2$) or dry air, which is expelled through the vacuum port 21. A valve 26 is provided in the gas channel 25 to adjust the gas flow.

The sapphire substrate 1 in the second embodiment has a diameter of six inches and a thickness of 0.6 mm. For the preheating stage of a semiconductor fabrication process, the vacuum channel valve 23 is closed, the sapphire substrate 1 is placed on the sloping surfaces 7a of the holders 7 on the supporting base 4 attached to the end of the lifting shaft 12, and the supporting base 4 is raised toward the hot plate 3 and stopped at a position where the distance between the hot plate 3 and the second major surface of the sapphire substrate is 2 mm.

The hot plate 3 is then heated to a preset temperature (380° C. in this embodiment) to heat the air in the space between the hot plate 3 and the sapphire substrate 1, and the heated air transfers heat to the sapphire substrate 1 from its second major surface side, thereby heating the sapphire substrate 1. During this heating process, the gas valve 26 is opened and gas supplied from the gas channel 25 is expelled from the vacuum port 21 toward the center of the sapphire substrate 1. The gas flows from the center of the sapphire substrate 1 toward the rim of the sapphire substrate 1, carrying heat with it, thereby reducing the rate of heating in the central portion of the sapphire substrate 1. The temperature if the gas between the hot plate 3 and the sapphire substrate 1 is controlled by using the gas valve 26 to control the gas flow rate. The rate is adjusted so that the entire second major surface of the sapphire substrate 1 is preheated to a substantially uniform temperature.

Figure 15:
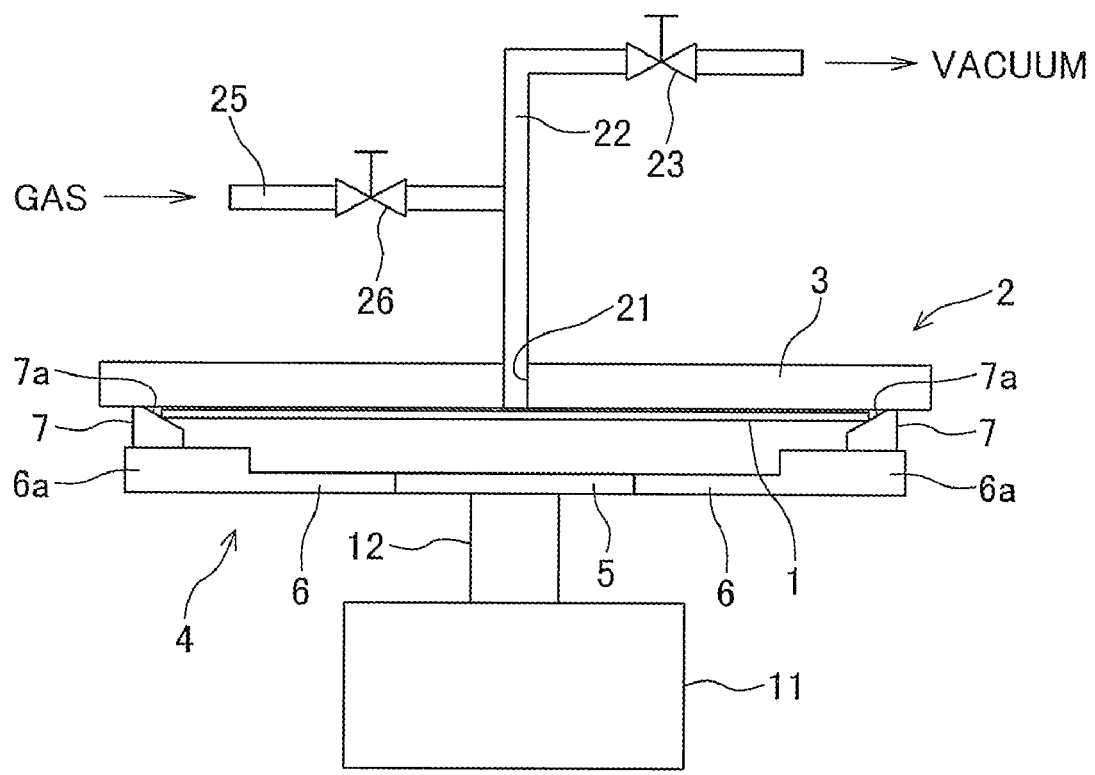
FIG. 15 is a sectional view illustrating a final stage in the preheating process in the second embodiment.

When the temperature of the sapphire substrate 1 reaches a predetermined temperature of, for example, at least 330° C., the lifting shaft 12 is raised to bring the second major surface of the sapphire substrate 1 closer to the lower surface of the hot plate 3 as shown in FIG. 15. The lifting shaft 12 dwells in this position for a predetermined time of, for example, three minutes while the flow of gas from the vacuum port 21 onto the second major surface of the sapphire substrate 1 continues.

By cooling the center of the sapphire substrate 1, the continuing gas flow removes any convex warping that may have occurred during the preheating process due to substrate fabrication variations or due to the heating of the substrate from only one side. The cooling of the central part of the sapphire substrate 1 by the gas flow pulls the rim of the substrate upward toward the hot plate 3, so that the rim becomes the highest part of the substrate.

After the predetermined time has elapsed, the gas valve 26 is closed to shut off the gas flow, the vacuum channel valve 23 is opened to supply vacuum to the vacuum port 21, and vacuum pressure pulls the sapphire substrate 1 upward toward the hot plate 3. Since the rim is now the highest part of the sapphire substrate 1, the rim is brought into contact with the hot plate 3. Vacuum suction evacuates the remaining gas from the enclosed space between the sapphire substrate 1 and the hot plate 3, so that the entire surface of the sapphire substrate 1 lies flat against the hot plate 3. Continuing vacuum pressure then holds the sapphire substrate 1 in this position.

With the sapphire substrate 1 held against the hot plate 3 in this way, the lifting shaft 12 is lowered to withdraw the holders 7 on the supporting base 4 from the sapphire substrate 1 and the intended semiconductor fabrication process is carried out on the sapphire substrate 1 while it is held against the hot plate 3.

The limits on the temperatures of the sapphire substrate 1 and the hot plate 3 mentioned in the first embodiment also apply to the second embodiment.

In the preheating process in the second embodiment, the sapphire substrate 1 is heated from only one side, which would normally cause the central part of the substrate to bulge toward the hot plate 3 and therefore overheat, but the gas flow from the vacuum port 21 counteracts this tendency by carrying heat away from the central part, so that the sapphire substrate 1 is heated in a substantially uniform manner over its entire surface and remains substantially flat. Some warping may still occur, because of the temperature gradient in the thickness direction of the sapphire substrate 1 or because of substrate fabrication variations, but the continuing cooling of the central part of the substrate during the final period of the preheating process, when the substrate has already reached the predetermined preheating temperature and is brought closer to the hot plate 3, assures that any residual warping will be concave, the rim being closer than the center to the hot plate. During this final period, the first major surface of the sapphire substrate 1 has time to reach a temperature substantially equal to the final temperature of the second major surface of the sapphire substrate 1, so that at the end of the final period, when the sapphire substrate 1 is pulled against the hot plate 3 by vacuum suction, the sapphire substrate 1 is already very nearly flat, and vacuum suction can hold the entire surface of the sapphire substrate against the hot plate 3. The preheating process is thereby completed without causing to substrate handling problems due to warping.

The gas flow also tends to smooth out heating irregularities that occur after patterned films have been formed on the sapphire substrate 1, by transferring heat from areas that have absorbed more radiant heat because of the presence of such films to areas that have absorbed less radiant heat because of the absence of such films. As a result, a substantially even temperature distribution is maintained over the surface of the sapphire substrate 1, which also helps to prevent warping of the sapphire substrate 1.

The same effect also prevents warping that might otherwise occur because of differing thermal expansion coefficients of the patterned films.

As described above, the second embodiment uses the vacuum port in the hot plate as a hole for expelling gas onto the sapphire substrate to cool the central part of the sapphire substrate when it is heated in an air-temperature atmospheric environment, to prevent the central part from bulging toward the hot plate. This enables the sapphire substrate to be heated in a substantially uniform manner without warping. Semiconductor fabrication processes that require preheating of the sapphire substrate can accordingly be carried out efficiently, without the occurrence of substrate handling problems due to warping.

In a variation of the second embodiment, a plurality of holes are drilled through the hot plate and used to expel gas onto the sapphire substrate at a plurality of points. A separate valve can be provided for each hole to enhance temperature controllability in the preheating process. The plurality of holes may also be used as vacuum ports as described above, or an existing plurality of vacuum ports may be used as holes for expelling gas.

The first and second embodiments may be combined by using a radiant heat absorbing plate facing the first major surface of the sapphire substrate as in the first embodiment, but also expelling gas onto the second major surface of the sapphire substrate as in the second embodiment. This combined scheme can prevent the warping that may occur in the first embodiment when films with coefficients of thermal expansion that differ from the thermal expansion coefficient of the sapphire substrate are formed on the sapphire substrate. In a variation of this scheme, gas is expelled only in the final stage, when the sapphire substrate has reached the intended temperature and is brought closer to the hot plate, to remove any residual warping.

The invention is not limited to a silicon-on-sapphire substrate in which a thin silicon semiconductor film is formed on the sapphire substrate. The thin semiconductor film may be a film of some other semiconductor material, such as gallium nitride (GaN), for example, which is useful for forming light-emitting diodes. The effects described above are obtained regardless of the type of semiconductor film employed.

The invention is not limited to semiconductor fabrication apparatus used for atmospheric-pressure CVD. Other types of apparatus in which the invention can be practiced include low-pressure CVD apparatus, single wafer plasma CVD apparatus, lamp annealing apparatus, stripping apparatus for stripping photoresist films and other films, and etching apparatus. The invention is expected to be of broad usefulness in the fabrication of semiconductor devices on sapphire substrates because it is applicable in any process that requires the sapphire substrate to be preheated in a comparatively low-temperature ambient atmospheric.

A few variations have been mentioned above, but those skilled in the art will recognize that further variations are possible within the scope of the invention, which is defined in the appended claims.

What is claimed is:

1. A semiconductor fabrication apparatus for heating a sapphire substrate in an atmospheric environment, the sapphire substrate having a first major surface and a second major surface opposite the first major surface, the semiconductor fabrication apparatus comprising:
   a hot plate;
   a supporting base including a supporting plate and a plurality of holders, the supporting plate facing the hot plate, the holders holding the sapphire substrate between the hot plate and the supporting plate so that the hot plate faces the second major surface of the sapphire substrate;
   a lifting device for raising and lowering the supporting base; and
   a radiant heat absorbing plate disposed on the supporting plate, facing the first major surface of the sapphire substrate, for absorbing heat radiated from the hot plate through the sapphire substrate,
   wherein the radiant heat absorbing plate has a plurality of notches through which the holders protrude.

2. The semiconductor fabrication apparatus of claim 1, wherein the radiant heat absorbing plate has an outer diameter equal to or greater than an outer diameter of the sapphire substrate.

3. The semiconductor fabrication apparatus of claim 1, wherein the holders have sloping surfaces on which the sapphire substrate rests.

4. The semiconductor fabrication apparatus of claim 1, wherein the radiant heat absorbing plate is made of aluminum.

5. The semiconductor fabrication apparatus of claim 1, wherein the hot plate has a hole for expelling a gas toward the sapphire substrate.

6. The semiconductor fabrication apparatus of claim 5, further comprising a vacuum channel for providing vacuum suction at the hole to hold the sapphire substrate.

7. A method of using a semiconductor fabrication apparatus to fabricate a semiconductor device, the semiconductor fabrication apparatus for heating a sapphire substrate in an atmospheric environment, the sapphire substrate having a first major surface and a second major surface opposite the first major surface, the semiconductor fabrication apparatus including
a hot plate,
a supporting base including a supporting plate and a plurality of holders, the supporting plate facing the hot plate, the holders holding the sapphire substrate between the hot plate and the supporting plate so that the hot plate faces the second major surface of the sapphire substrate,
a lifting device for raising and lowering the supporting base, and
a radiant heat absorbing plate disposed on the supporting plate, facing the first major surface of the sapphire substrate, for absorbing heat radiated from the hot plate through the sapphire substrate,
the method comprising:
placing the sapphire substrate so that it is supported between the hot plate and the radiant heat absorbing plate by the holders, the first major surface of the sapphire substrate facing the radiant heat absorbing plate;
operating the lifting device to bring the second major surface of the sapphire substrate to a predetermined distance from the hot plate;
heating the hot plate, thereby heating the radiant heat absorbing plate with heat radiated from the hot plate so that the sapphire substrate is heated at both the first and second major surfaces;
operating the lifting device to bring the heated sapphire substrate into contact with the hot plate;
holding the heated sapphire substrate against the hot plate; and
carrying out a semiconductor fabrication process on the sapphire substrate while the sapphire substrate is held against the hot plate.

8. The method of claim 7, wherein the sapphire substrate has a thickness, and while the sapphire substrate is being heated, the hot plate and the radiant heat absorbing plate are separated by a distance equal to at least three times said thickness.

9. The method of claim 7 wherein, while the sapphire substrate is being heated, the hot plate and the radiant heat absorbing plate are separated by a distance of at most five millimeters.

10. The method of claim 7, wherein the sapphire substrate has a thickness, and while being heated, the sapphire substrate is held at distances at least equal to said thickness from the hot plate and the radiant heat absorbing plate.

11. The method of claim 7, wherein said heating the hot plate comprises heating the hot plate to a preset temperature.

12. The method of claim 11, wherein the preset temperature is at least three hundred degrees Celsius higher than a temperature of the atmospheric environment.

13. The method of claim 11, wherein the sapphire substrate is brought into contact with the hot plate only after the sapphire substrate has reached a temperature differing from the preset temperature by at most one hundred degrees Celsius.

14. The method of claim 11, wherein the sapphire substrate is brought into contact with the hot plate only after the sapphire substrate has reached a temperature differing from the preset temperature by at most fifty degrees Celsius.

15. A method of using the semiconductor fabrication apparatus of claim 5 to fabricate a semiconductor device, comprising:
placing the sapphire substrate so that it is supported between the hot plate and the radiant heat absorbing plate by the holders, the first major surface of the sapphire substrate facing the radiant heat absorbing plate;
heating the hot plate, thereby heating the radiant heat absorbing plate with heat radiated from the hot plate so that the sapphire substrate is heated at both the first and second major surfaces and rises in temperature;
operating the lifting device to bring the heated sapphire substrate closer to the hot plate;
expelling the gas onto the second major surface of the heated sapphire substrate from the hole;
operating the lifting device to bring the heated sapphire substrate into contact with the hot plate, after said expelling the gas;
holding the heated sapphire substrate against the hot plate; and
carrying out a semiconductor fabrication process on the sapphire substrate while the sapphire substrate is held against the hot plate.

16. The method of claim 15, wherein said expelling the gas comprises expelling the gas for at least one minute.

17. A method of using the semiconductor fabrication apparatus of claim 5 to fabricate a semiconductor device, comprising:
placing the sapphire substrate so that it is supported between the hot plate and the radiant heat absorbing plate by the holders, the second major surface of the sapphire substrate facing hot plate;
operating the lifting device to bring the sapphire substrate to a first distance from the hot plate;
expelling the gas onto the second major surface of the sapphire substrate from the hole;
heating the hot plate while continuing to expel the gas onto the second major surface of the sapphire substrate, thereby heating the sapphire substrate;
operating the lifting device to bring the heated sapphire substrate to a second distance from the hot plate, the second distance being less than the first distance, and
continuing to hold the heated sapphire substrate at the second distance from the hot plate for a predetermined time;
continuing to expel the gas onto the second major surface of the heated sapphire substrate from the hole during the predetermined time;
operating the lifting device to bring the heated sapphire substrate into contact with the hot plate, after said continuing to expel the gas;
holding the heated sapphire substrate against the hot plate; and
carrying out a semiconductor fabrication process on the held sapphire substrate.

18. The method of claim 17, wherein the predetermined time is greater than one minute.

19. The method of claim 17, wherein the gas is expelled onto a central portion of the sapphire substrate.

* * * * *